(12) United States Patent
Souetinov

(10) Patent No.: US 7,016,664 B2
(45) Date of Patent: Mar. 21, 2006

(54) MIXER CIRCUIT ARRANGEMENT AND AN IMAGE-REJECT MIXER CIRCUIT ARRANGEMENT

(75) Inventor: Viatcheslav Igorevich Souetinov, Swindon (GB)

(73) Assignee: Zarlink Semiconductor Limited, Swindon (GB)

( * ) Notice: Subject to any disclaimer, the term of this patent is extended or adjusted under 35 U.S.C. 154(b) by 498 days.

(21) Appl. No.: 10/190,879

(22) Filed: Jul. 3, 2002

(65) Prior Publication Data

US 2003/0017816 A1  Jan. 23, 2003

(30) Foreign Application Priority Data

Jul. 5, 2001  (GB)  ................................ 0116475

(51) Int. Cl.
*H04B 1/26* (2006.01)
(52) U.S. Cl. .................. 455/323; 455/252.1; 455/333; 327/214; 327/272; 327/437; 330/299
(58) Field of Classification Search ............... 455/323, 455/324, 325, 326, 333, 334, 338, 340, 311, 455/73, 75, 91, 95, 130, 136, 194.2, 195.1, 455/214, 219, 220; 326/24, 45, 50, 58, 64, 326/68, 103, 129
See application file for complete search history.

(56) References Cited

U.S. PATENT DOCUMENTS

| 5,768,700 | A | | 6/1998 | Kardontchik | |
|---|---|---|---|---|---|
| 5,859,566 | A | * | 1/1999 | Voorman et al. ............ | 330/252 |
| 5,870,670 | A | * | 2/1999 | Ripley et al. ............... | 455/304 |
| 6,226,509 | B1 | * | 5/2001 | Mole et al. ................. | 455/302 |
| 6,631,257 | B1 | * | 10/2003 | White et al. ................ | 455/333 |

FOREIGN PATENT DOCUMENTS

| DE | 694 21 692 T 2 | 7/2000 |
|---|---|---|
| EP | 0 684 698 A1 | 11/1995 |
| GB | 2 331 193 | 5/1999 |
| GB | 0116475.5 | 8/2001 |

OTHER PUBLICATIONS

A. N. Karanicolas "A 2.7-V 900-MHz CMOS LNA and Mixer" IEEE J. of Solid-State Circuits, vol. 31, pp. 1939-1944, Dec. 1996.

A. Rofouguran, G. Chang, J.J. Rael et al "A Single-Chip 900-MHz Spead-Spectrum Wireless Transceiver in 1-$\mu$m CMOS—Part II: Receiver Design" IEEE J. of Solid-State Circuits, vol. 33, pp 535-547, Apr. 1998.

(Continued)

*Primary Examiner*—Edward F. Urban
*Assistant Examiner*—Thuan T Nguyen
(74) *Attorney, Agent, or Firm*—Dority & Manning, P.A.

(57) ABSTRACT

A mixer circuit arrangement 30 comprises a complementary transconductor circuit 31 and a mixer stage 32. The complementary transconductor circuit 31 includes two paths in parallel between a positive supply voltage VDD and ground G and is connected directly between the voltage supply terminals VDD and G. The first path includes a P-type MOS transistor TP1 and an N-type MOS transistor TN1 connected in series. Similarly, the second path includes a P-type MOS transistor TP2 and an N-type MOS transistor TN2 connected in series. The gate electrodes of the P-type transistors TP1 and TP2 are connected to a voltage bias Vbp via high value bias resistors $R_b$, and the gate electrodes of the N-type transistors TN1 and TN2 are connected to a second voltage bias Vbn via high value bias resistors $R_b$. The mixer stage 32 is connected between the output of the complementary transconductor circuit 31 and a load, the load also being connected to one of the supply terminals.

20 Claims, 3 Drawing Sheets

OTHER PUBLICATIONS

F. Behbahani, J. C. Lette, Y. Kishigami et al A 2.4-GHz Low-IF Receiver for Wideband WLAN 0.6-$\mu$m CMOS—Architecture and Front-End. IEEE J. of Solid-State Circuits, vol. 35, pp. 1908-1916, Dec. 2000.

Karanicolas, A.N., A 2.7-V 900-MHz CMOS LNA and mixer, pp. 1939-1944, IEEE Journal of Solid-State Circuits, vol. 31, No. 12, Dec. 1996.

* cited by examiner

MIXER CIRCUIT ARRANGEMENT AND AN IMAGE-REJECT MIXER CIRCUIT ARRANGEMENT

CROSS-REFERENCE TO RELATED APPLICATIONS

The present application claims priority to currently pending United Kingdom Patent Application number 0116475.5, filed on Jul. 5, 2001.

STATEMENT REGARDING FEDERALLY SPONSORED RESEARCH OR DEVELOPMENT

N/A

BACKGROUND OF THE INVENTION

The present invention relates to a mixer circuit arrangement and to an image-reject mixer circuit arrangement.

Mixer circuits for high frequency applications constructed using metal oxide semiconductor (MOS) transistors are subject to a limited voltage supply (usually less than 2 volts) and high levels of flicker noise, having frequencies extending up to several tens of MHz. Accordingly, the gain and output signal level required in such mixer circuits are greater than those required in the equivalent bipolar circuits.

It is known to construct a mixer circuit using MOS transistors using an arrangement translated directly from the conventional bipolar Gilbert cell mixer. Such MOS mixer circuits and modifications thereof are known from, for example, F. Behbahani, J. C. Lette, Y. Kishigami et al "A 2.4-GHz Low-IF Receiver for Wideband WLAN 0.6-um CMOS—Architecture and Front-End. "IEEE J. of Solid-State Circuits, vol. 35, pp. 1908–1916, December 2000; A. Rofouguran, G. Chang, J. J. Rael et al "A Single-Chip 900-MHz Spead-Spectrum Wireless Transceiver in I-um CMOS—Part II: Receiver Design." IEEE J. of Solid-State Circuits, vol. 33, pp 535–547, April 1998; and A. N. Karanicolas "A 2.7-V 900-MHz CMOS LNA and Mixer." IEEE J. of Solid-State Circuits, vol. 31, pp. 1939–1944, December 1996. One such mixer circuit is shown schematically in FIG. 1.

Referring to FIG. 1, the mixer circuit 10 comprises generally first and second N-type MOS transistors TN1 and TN2, which constitute a transconductor and which have their control or gate electrodes connected to respective terminals 13, 14 of a different input RFN, RFP. A Gilbert cell mixer core is comprised of four further NMOS transistors 15 to 18, and a differential output is provided at terminals IFP, IFN between the mixer core and load resistors RL, which are also connected to a positive voltage supply VDD. The conversion gain of the mixer circuit 10 is moderately low, since the gain is proportional to the voltage headroom available. The mixer circuit, in effect, includes a transconductor, a mixer core and a load connected in series between the voltage supply terminals.

The arrangement described in the Karanicolas paper mentioned above has not proved to be practical since it requires approximately double the amount of headroom of the equivalent conventional circuit. Another mixer circuit is described in U.S. Pat. No. 5,768,700, and is shown schematically in FIG. 2.

Referring to FIG. 2, the mixer circuit 20 is shown comprising the FIG. 1 mixer circuit (reference numerals are retained for like elements), and a folded-cascode output stage comprising P type MOS transistors TP1 and TP2, load resistors RL2 and load capacitors CL. In this mixer circuit 20. the currents $I_o$ flowing through the transistors TP1 and TP2 can be significantly lower than those flowing through the mixer core, and it is therefore possible to have RL2>>RL1. Since the ac component of the output current of the mixer core is then directed largely to the output stage, a larger output signal is produced in comparison with the FIG. 1 mixer circuit. However, the mixer circuit 20 has relatively high current consumption because the transistors TN1 and TN2 must be biased with high dc currents in order to provide a linear current response. Also, the mixer core transistors 15 to 18 must perform hard switching of this high dc bias current, which requires the use of a powerful local oscillator (LO) driver.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

OBJECTS AND SUMMARY OF THE INVENTION

Objects and advantages of the invention will be set forth in part in the following description, or may be obvious from the description, or may be learned through practice of the invention.

The present subject matter recognizes and addresses various drawbacks and other shortcomings related to mixer circuits and corresponding mixer circuit applications. Thus, the presently disclosed technology is directed to an improved mixer circuit configuration, which may be utilized as an image-reject mixer circuit and/or in conjunction with signal processing in a radio communications device.

An image-reject circuit in accordance with the present invention offers many advantages. A particular advantage in accordance with aspects of the present technology corresponds to the beneficial use of the disclosed mixer circuit in RF communications devices, especially those transmitting and receiving relatively high frequency signals. Such a mixer circuit can be used in a radio communications receiver to facilitate demodulation and processing of a received signal. Exemplary devices that may utilize such a radio communications device include cellular phones, computers, satellite communication receivers, and other devices in a wired or wireless network environment.

A still further advantage of the present technology corresponds to improved performance characteristics of the subject mixer circuit arrangements as compared with the disclosed prior art configurations. Selected exemplary embodiments of the disclosed technology are characterized by good linearity characteristics and a conversion gain of at least about 6.5 dB. Some embodiments of the technology disclosed herein are capable of providing for a conversion gain from input to output of about 11.0 dB. This gain may be even higher in a circuit with different input variables and signal characteristics.

Exemplary embodiments of the disclosed technology generally include a complementary transconductor circuit connected between two voltage supply terminals and configured to receive an input and provide a corresponding output. The inputs and outputs are differential signals provided at respective first and second input and output terminals. A mixer stage with a mixer core having metal oxide semiconductor (MOS) transistors is connected between the output of the complementary transconductor and a load, which is also connected to one of the voltage supply terminals.

The complementary transconductor circuit comprises two MOS transistors of a first conductivity type, and two MOS transistors of a second conductivity type. Two sets of a first type and a second type of MOS transistors connected in series are provided between the two voltage supply terminals. Control electrodes of the first type of MOS transistor are connected to the first input terminal and control electrodes of the second type of MOS transistor are connected to the second input terminal. Respective first and second output terminals are tied to the connection between each first and second type of MOS transistor.

The load portion of exemplary embodiments of the present technology include a resistor and a capacitor provided in parallel. The mixer core in accordance with select exemplary embodiments corresponds to a Gilbert cell type mixer core with MOS transistors of either the first or second conductivity type.

Still further exemplary embodiments of the disclosed technology concern an image-reject mixer circuit arrangement with a complementary transconductor circuit characterized by differential inputs and outputs, a quadrature mixer circuit and an in-phase mixer circuit. The quadrature and in-phase mixer stages are connected in parallel between the complementary transconductor circuit differential outputs and respective loads. The loads may comprise resistor and capacitor elements provided in parallel and connected to a supply voltage.

Still further embodiments of the present subject matter correspond to a radio communications device having a mixer circuit arrangement to process selected signals. Such a radio communications device comprises a complementary transconductor circuit connected between first and second voltage supply terminals and a mixer stage between the transconductor circuit and a load. The mixer stage may include metal oxide semiconductor (MOS) transistors and could comprise a Gilbert cell type mixer core. Such a radio communications device is capable of processing received high-frequency signals with sufficient levels of conversion gain.

Other aspects and features of the present subject matter will become apparent to those of ordinary skill in the art upon review of the following description of specific embodiments of the invention in conjunction with the accompanying figures.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

Figure 3:
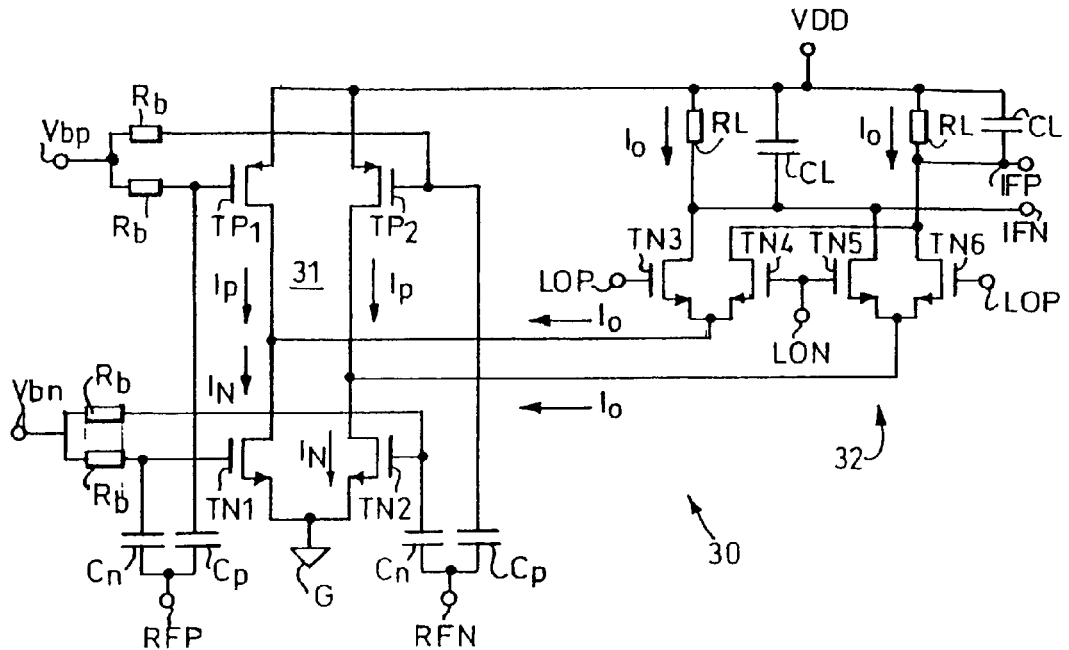
FIGS. 3, 4 and 5 are schematic diagrams of, respectively, first to third mixer circuit arrangements in accordance with the invention.

Referring to FIG. 3, a mixer circuit arrangement 30 in accordance with the invention comprises generally a complementary transconductor circuit arrangement 31 and a mixer stage 32. The complementary transconductor 31 includes two paths in parallel between a positive supply voltage VDD and ground G. The complimentary transconductor 31 is connected directly between these voltage supply terminals VDD and G. The first path includes a P-type MOS transistor TP1 and an N-type MOS transistor TN1 connected in series. Similarly, the second path includes a P-type MOS transistor TP2 and an N-type MOS transistor TN2 connected in series. The gate electrodes of the P-type transistors TP1 and TP2 are connected to a voltage bias Vbp via high value bias resistors $R_b$, and the gate electrodes of the N-type transistors TN1 and TN2 are connected to a second voltage bias Vbn via high value bias resistors $R_b$. A differential input signal is applied via terminals RFP and RFN. The terminal RFP is connected to the gate of the transistor TN1 via a coupling capacitor $C_p$, and to the gate of the transistor TP1 via a further coupling capacitor $C_n$. The terminal RFN is similarly connected to the gates of the transistors TP2 and TN2 via respective coupling capacitors $C_p$ and $C_n$. Vbp defines the bias current $I_p$, of the transistors TP1 and TP2, and Vbn defines the bias current $I_N$ of the transistors TN1 and TN2. A differential output is provided at the connection of the transistors TP1 and TN1 and at the connection of the transistors TP2 and TN2. In this specification, the term complementary transconductor means a transconductor having at least two MOS transistors of opposite conductivity types each of which receive an input signal and which together provide an output signal from a path which couples the two transistors. The transconductor 31 includes two such pairs of transistors.

The differential output is connected to a differential input of a Gilbert cell mixer core, formed by N-type mixer transistors TN3 to TN6. The mixer core also receives a differential local oscillator input signal at inputs LOP and LON, and provides a differential output signal at outputs IFP and IFN, which are each connected to VDD by a respective resistor RL and a respective capacitor CL connected in parallel. The current $I_o$ flowing through the load resistors RL passes through the mixer core to the transconductor 31.

The bias current $I_o$ of each load resistor RL is:

$$I_o = I_N - I_p \qquad \text{Equation 1}$$

The DC voltage drop $U_L$ across the loads RL is equal:

$$U_L = I_o R_L \qquad \text{Equation 2}$$

The conversion gain $A_c$ of a Gilbert cell type mixer with an ideally switching mixer core is:

$$A_c = (2/\pi) g_m R_L \qquad \text{Equation 3}$$

Here, $g_m$ is the transconductance of the transconductor 31; $(2/\pi)$ is a conversion coefficient $c_c$ of an ideally switching mixer core (although in practical cases it is smaller than the theoretical value and for high frequency mixers it is $c_c \ll 2/\pi$).

Assuming the load capacitors CL are small in value, the conversion gain of the mixer circuit 30 is:

$$A_c = 2(g_{mn} + g_{mp}) c_c R_L \qquad \text{Equation 4}$$

Here $g_{mn}$ is the transconductance of the transistors TN1 and TN2, and $g_{mp}$ is the transconductance of the transistors TP1 and TP2.

The transconductance of deep submicron MOS transistors achieves a maximum value at a certain level of bias voltage, and then remains substantially constant as bias voltage is increased over a range before it starts to degrade. The linear region of the transfer function $I_D = f(U_{GS})$ is mostly used in the input transconductor stages in order to provide linear response to the input signal. In the linear region, the absolute value of transconductance is proportional to the device width, and hence also the bias current.

Since a MOS transistor threshold voltage exhibits variations, the device operating point is defined more practically by the bias current using the current mirror technique. Therefore, it is reasonable to assume that transconductance is proportional to bias current:

$$G_{mn} = I_N K_n \qquad \text{Equation 5}$$

$$G_{mp} = I_P K_p \qquad \text{Equation 6}$$

$$K_p \approx 0.5 \, K_n \qquad \text{Equation 7}$$

Here, $K_n$ and $K_p$ are coefficients for NMOS and PMOS transistors respectively.

Substitution of equations 1, 2, 5, 6 and 7 in equation 4 gives:

$$A_c = 2K_n [I_N + 0.5(I_N - I_o)] c_c (U_L/I_o) \qquad \text{Equation 8}$$

It is worth noting that the total bias current of the mixer circuit 30 is $2I_N$.

Figure 1:
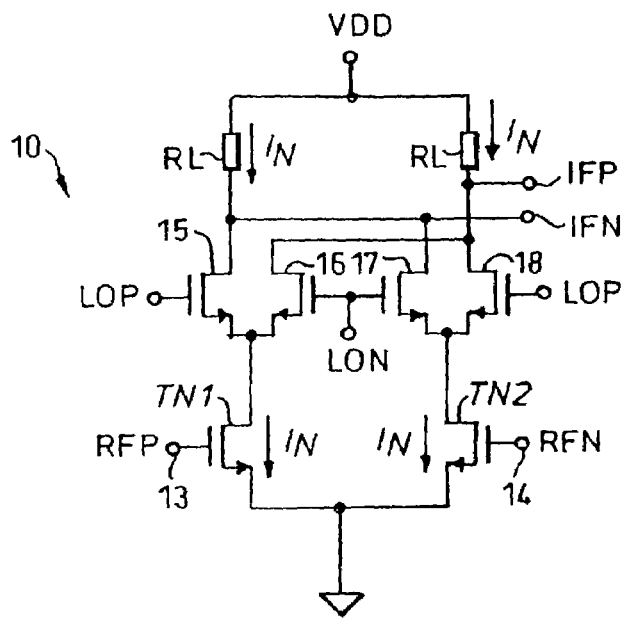
FIGS. 1 and 2 are schematic diagrams of prior art mixer circuits.
Figure 2:
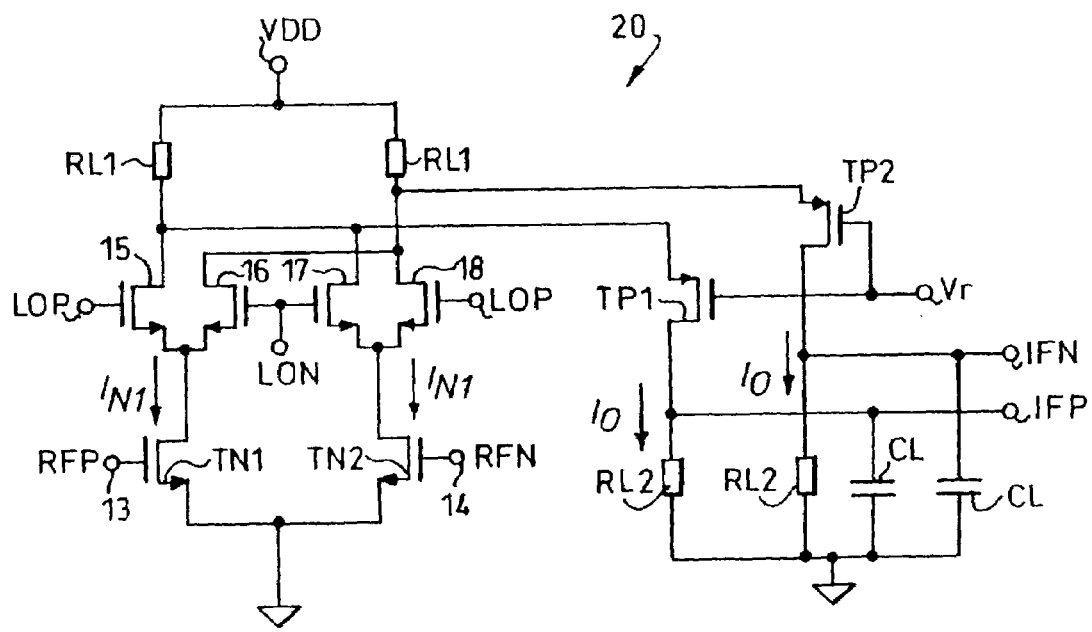

Applying a similar analysis to the prior art mixers of FIGS. 1 and 2, it is possible to express their conversion gains in a similar form:

$$\text{FIG. 1} - A_{c1} = 2K_n c_c U_L \qquad \text{Equation 9a}$$

$$\text{FIG. 2} - A_{c2} = 2K_n I_{N1} c_c (U_L/I_O) \qquad \text{Equation 9b}$$

Here, $U_L$ is the DC voltage drop across the load resistors for both mixers but, for the mixer in FIG. 2, this voltage drop is in the output stages. $I_{N1}$ is the bias current of the transistors TN1 and TN2, while $I_O$ is the bias current of each folded-cascode output stage in FIG. 2. It is also assumed that there is no signal loss between the mixer core and the folded-cascode output stage.

The total current consumption of these mixers is:

$$\text{FIG. 1} - I_{T1} = 2I_N \qquad \text{Equation 10a}$$

$$\text{FIG. 2} - I_{T2} = 2(I_{N1} + I_o) \qquad \text{Equation 10b}$$

Analysis of equations 8, 9a and 9b shows that the conversion gain of the FIG. 1 mixer is directly limited by available headroom and, for the approximation of these equations, does not depend on bias current, and that the conversion gain of the mixers of FIG. 2 and FIG. 3 is also proportional to the available headroom but can be adjusted by the ratio of currents in the input stage and in the load.

The gains of these three mixers have to be compared for the same current consumption, for instance $2I_N$. For this purpose, the conversion gain of the FIG. 2 mixer is (rearranging equations 9b and 10b):

$$A_{C2} = 2K_n \cdot (I_N - I_o) c_c (U_L/I_o) \qquad \text{Equation 11}$$

Assuming, for example, that $I_o = I_N/5$, the equations 8 and 9b can be simplified as:

$$\text{FIG. 3} - A_c = 14 K_n c_c U_L \qquad \text{Equation 12}$$

$$\text{FIG. 2} \, A_{C2} = 8 K_n c_c U_L \qquad \text{Equation 13}$$

Comparison of the gains of all mixers gives:

$$(A_C/A_{C1}) = 7 = 16.9 \text{ dB} \qquad \text{Equation 14}$$

$$(A_C/A_{C2}) = 1.75 = 4.86 \text{ dB} \qquad \text{Equation 15}$$

Thus the FIG. 3 mixer provides notably higher gain than the FIGS. 1 and 2 prior art mixers for the same current consumption. The actual difference is even bigger than that given by equations 14 and 15 since the losses in the folded-cascode output stage of the FIG. 2 mixer were not considered.

There are some additional advantages of the mixer of FIG. 3, namely that the mixer core switches significantly lower current than the prior art mixer cores, resulting in additional current savings in LO blocks, and that the input complementary stage provides higher linearity and larger dynamic range than the input common source stage of the prior art mixers.

For 0.18 micron CMOS technology, it can be assumed that: VDD=1.8 V; $U_L$, 0.5 V; $c_c$=0.2; and $K_n$=2.5 1/V. Substitution of these parameters into equations 9a, 12 and 13 allows an estimation of the potential conversion gain of the analysed mixers to be made:

$$A_{CL} = -6.0 \text{ dB}; A_{C2} = 6.04 \text{ dB}; A_C = 10.9 \text{ dB}.$$

If the intermediate frequency (IF) is low, for instance less than 10 or so MHz, it is more advantageous to use a mixer core based on PMOS transistors, since the latter exhibit considerably better noise properties than NMOS transistors at low frequencies, where flicker noise is dominant.

Figure 4:
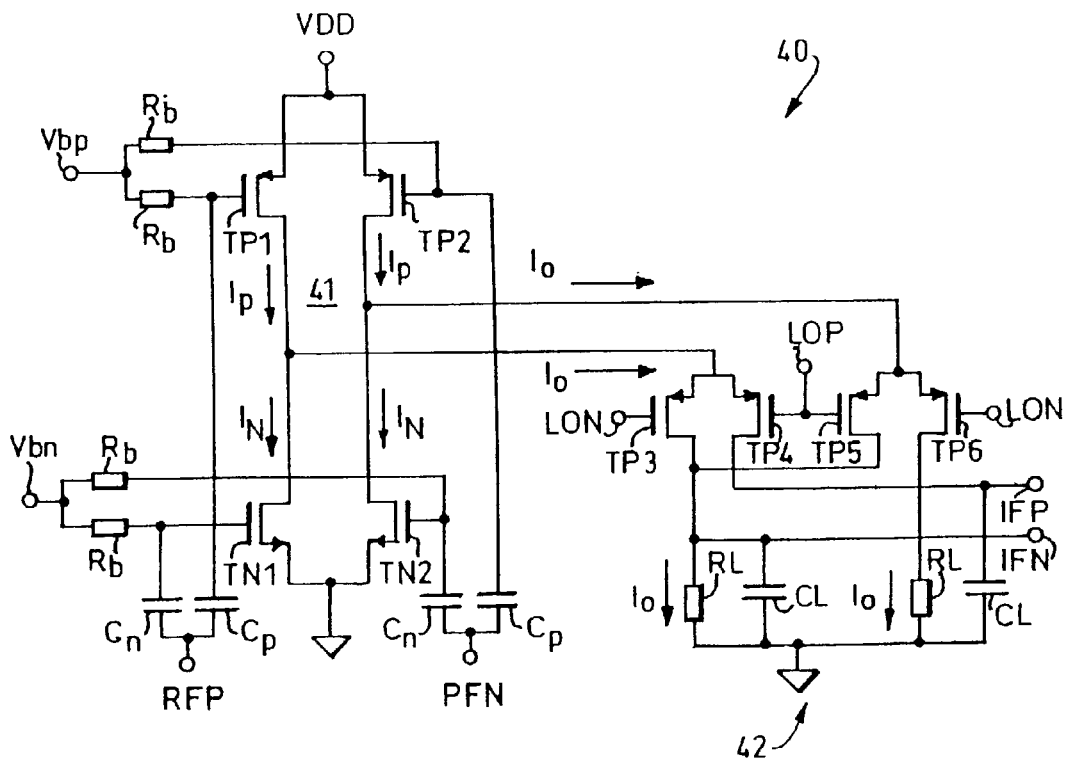

Referring now to FIG. 4, a second mixer circuit arrangement 40 in accordance with the invention includes a transconductor circuit arrangement 41 and a folded mixer stage 42. The transconductor circuit 41 is the same as the FIG. 3 transconductor circuit.

The folded mixer stage includes first to fourth P-type MOS transistors TP3 to TP6, which are connected as a Gilbert cell mixer core. First and second outputs of the mixer core are connected to ground potential by a respective load, the loads each consisting of a resistor RL and a capacitor CL connected in parallel. Intermediate frequency output terminals IFP and IFN are provided at outputs of the mixer core.

The bias currents in the resistive loads RL are:

$$I_O = I_P - I_N \qquad \text{Equation 16}$$

The total current consumption is $2I_P$.

At low IF frequencies, it is usual to use DC connections between IF blocks, and in such cases the output DC level has to be stable in the temperature and process variation ranges to achieve proper operation. To achieve this, the DC bias current $I_O$ must be temperature independent but correlated with resistor value, for example $I_O \sim E_G/R$, where $E_G$ is the band gap voltage.

At the same time, the temperature dependence of the transconductance of the input stage must be compensated by biasing it with a current which is directly proportional to the absolute temperature (PTAT), in order to minimize variations in gain with temperature. This problem can be successfully resolved using a current mirror to provide the following bias currents separately in the PMOS and NMOS transistors:

$$I_P = I_O + I_{PTAT} \quad \text{Equation 17}$$

$$I_N = I_{PTAT} \quad \text{Equation 18}$$

Since normally $I_O$ is much greater than $I_{PTAT}$, the input stage is biased most by the PTAT current, which provides minimum gain variations while the output DC levels defined by equation 2 are stable in the temperature and process variation range.

By selecting a suitable value of the bypass capacitors CL, power handling is improved, especially when the IF is low. In this case, all blocking signals which are separated from the input RF signal by +/− several IF are attenuated by a substantial amount.

Figure 5:
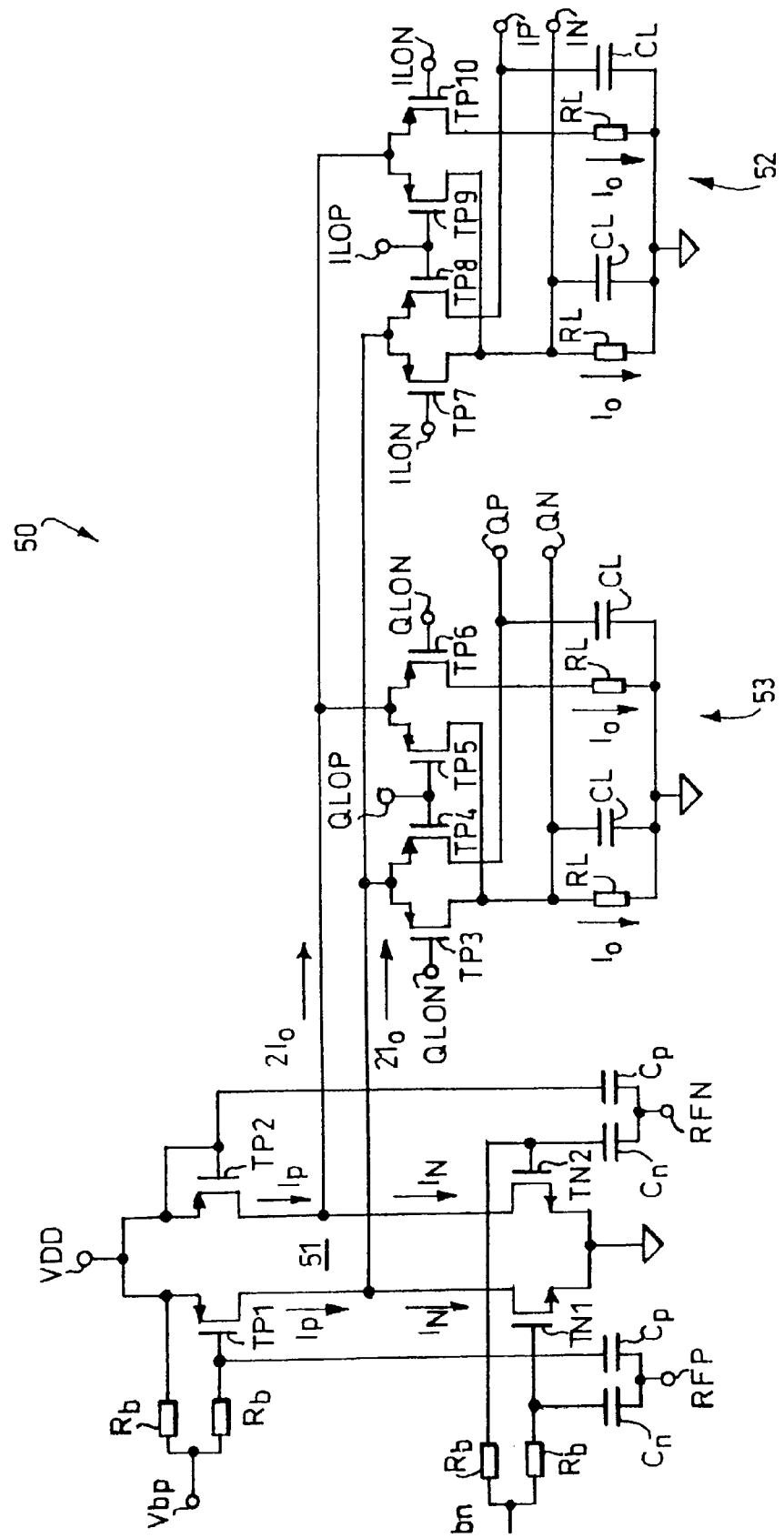

Referring now to FIG. 5, an image-reject mixer circuit arrangement 50 in accordance with the invention comprises generally a transconductor circuit 51, an in-phase folded mixer stage 52 and a quadrature folded mixer stage 53. The transconductor circuit 51 is the same as the FIG. 3 transconductor circuit. The in-phase and quadrature mixer stages 52 and 53 are each the same as the FIG. 4 mixer stage. The in-phase mixer stage 52 is provided with in-phase local oscillator (LO) signals ILON and ILOP, and has in-phase output terminals IP and IN, whereas the quadrature mixer stage 53 has quadrature LO inputs QLON and QLOP, and has quadrature output terminals QP and QN.

The mixer stages 52 and 53 are connected in parallel between the transconductor circuit 51 and ground potential. The connection of two mixer stages in this way is possible with MOS technology whereas it is not in bipolar technology because MOS transistors have more linear transfer characteristics than bipolar transistors and since MOS transistors do not require gate electrode DC input currents. These properties allow good matching of the DC currents biasing the mixer cores of the mixer stages 52, 53.

The image-reject mixer circuit 50 has good linearity characteristics and a high conversion gain without having a high current drain. Also, the second harmonics of the quadrature local oscillator signals leaking to the RF inputs of the mixer core cancel each other out since they have a 180° phase relationship. This results in improved phase quadrature of the output signals.

Experiments have shown that using $I_{PTAT}$ and $I_O$ with a 1.6 to 1.8 V supply and with an RF frequency of 2.5 GHz and an IF frequency of 1 MHz, gain of 6.7 to 8.1 dB is obtainable over a temperature range of −30 to +90° C. Over this temperature range, DC output voltage varies by only 2 mV.

In another embodiment (not shown), an image-reject mixer circuit arrangement includes folded mixer stages like that of FIG. 3, referred to VDD.

In the claims, the term "connected" will be understood to include a connection made via one or more circuit elements or devices, in addition to a connection made directly.

While at least one presently preferred embodiment of the invention has been described using specific terms, such description is for illustrative purposes only, and it is to be understood that changes and variations may be made without departing from the spirit or scope of the following claims.

What is claimed is:

1. A mixer circuit arrangement comprising:
   a first voltage supply terminal and a second voltage supply terminal;
   a load connected to one of the supply terminals;
   a complementary transconductor circuit comprising at least two metal oxide semiconductor (MOS) transistors of opposite conductivity types connected between first and second voltage supply terminals, the complementary transconductor circuit having an input and an output and being configured to provide at the output, output signals that are representative of signals received at the input; and
   a mixer stage including a mixer core having metal oxide semiconductor (MOS) transistors, the mixer stage being connected between the output of the complementary transconductor circuit and a load.

2. A mixer circuit arrangement as in claim 1, wherein the mixer core is a Gilbert cell mixer core.

3. A mixer circuit arrangement as in claim 1, wherein the mixer circuit is employed as an image-reject mixer circuit and has a conversion gain from input to output of at least 6.5 dB.

4. A mixer circuit arrangement as in claim 3, wherein the image-reject mixer circuit has a conversion gain from input to output of at least about 10.0 dB.

5. A mixer circuit arrangement as in claim 1, wherein the load comprises a resistor and a capacitor connected in parallel.

6. A mixer circuit arrangement as in claim 1, wherein the complementary transconductor circuit is a differential input, differential output transconductor circuit, with first and second input terminals constituting the input and first and second output terminals constituting the output, and wherein the at least two MOS transistors include:
   first and second MOS transistors of a first conductivity type; and
   third and fourth MOS transistors of a second conductivity type;
   the first and second transistors being connected to the first voltage supply terminal, the third transistor being connected between the first transistor and the second supply terminal, and the fourth transistor being connected between the second transistor and the second supply terminal, such that the first and the third transistors are connected in series between the supply terminals, and the second and the fourth transistors are connected in series between the supply terminals, control electrodes of the first and third transistors being connected to the first input terminal and control electrodes of the second and fourth transistors being connected to the second input terminal, the first output terminal being connected to the connection of the first and the third transistors, and the second output terminal being connected to the connection of the second and the fourth output terminals.

7. A mixer circuit arrangement as in claim 6, in which the mixer core is connected between a load, which is connected to a more positive one of the supply terminals, and the output terminals of the transconductor circuit, and includes MOS transistors of the second conductivity type.

8. A mixer circuit as in claim 7, wherein the load comprises a resistor and a capacitor connected in parallel, and wherein the mixer core is a Gilbert cell type mixer core.

9. A mixer circuit arrangement as in claim 8, wherein the mixer circuit is employed as an image-reject mixer circuit and has a conversion gain from input to output of at least about 10.0 dB.

10. A mixer circuit arrangement as claimed in claim 6, in which the mixer core is connected between a load, which is connected to a more negative one of the supply terminals, and the output terminals of the transconductor circuit, and includes MOS transistors of the first conductivity type.

11. A mixer circuit as in claim 10, wherein the load comprises a resistor and a capacitor connected in parallel, and wherein the mixer core is a Gilbert cell type mixer core.

12. A mixer circuit arrangement as in claim 11, wherein the mixer circuit is employed as an image-reject mixer circuit and has a conversion gain from input to output of at least about 10.0 dB.

13. An image-reject mixer circuit arrangement comprising:
a complementary transconductor circuit comprising first and second metal oxide semiconductor (MOS) transistors of a first conductivity type, and third and fourth metal oxide semiconductor (MOS) transistors of a second conductivity type, the complementary transconductor circuit further having a differential input and a differential output;
a quadrature mixer stage and an in-phase mixer stage each including metal oxide semiconductor transistors, the mixer stages being connected in parallel between the complementary transconductor circuit differential output and respective loads, which loads are also connected to a first voltage supply terminal.

14. An image-reject mixer circuit as in claim 13, wherein the load comprises a resistor and a capacitor connected in parallel.

15. An image-reject mixer circuit as in claim 13, wherein the complementary transconductor circuit comprises first and second input terminals constituting the differential input and first and second output terminals constituting the differential output,
the first and second transistors being connected to the first voltage supply terminal, the third transistor being connected between the first transistor and a second voltage supply terminal, and the fourth transistor being connected between the second transistor and the second voltage supply terminal, such that the first and the third transistors are connected in series between the first and second supply terminals, and the second and the fourth transistors are connected in series between the first and second supply terminals, control electrodes of the first and third transistors being connected to the first input terminal and control electrodes of the second and fourth transistors being connected to the second input terminal, the first output terminal being connected to the connection of the first and the third transistors, and the second output terminal being connected to the connection of the second and the fourth output terminals.

16. An image-reject mixer circuit as in claim 15, in which the metal oxide semiconductor (MOS) transistors of the quadrature mixer stage and the in-phase mixer stage comprise MOS transistors of the second conductivity type.

17. An image-reject mixer circuit as in claim 16, wherein the load comprises a resistor and a capacitor connected in parallel and wherein the mixer core is a Gilbert cell type mixer core.

18. An image-reject mixer circuit as in claim 16, wherein the mixer circuit is employed as an image-reject mixer circuit and has a conversion gain from input to output of at least about 10.0 dB.

19. A radio communications device, comprising:
a mixer circuit the mixer circuit including:
a first voltage supply terminal and a second voltage supply terminal;
a load connected to one of the supply terminals;
a complementary transconductor circuit comprising at least two metal oxide semiconductor (MOS) transistors of opposite conductivity types connected between first and second voltage supply terminals, the complementary transconductor circuit having an input and an output and being configured to provide at the output, output signals that are representative of signals received at the input; and
a mixer stage including a mixer core having metal oxide semiconductor (MOS) transistors, the mixer stage being connected between the output of the complementary transconductor circuit and a load.

20. A radio communications device as in claim 19, wherein the load comprises a resistor and a capacitor connected in parallel, and wherein the mixer core is a Gilbert cell type mixer core.

* * * * *